United States Patent [19]

Wagner

[11] Patent Number: 5,230,753
[45] Date of Patent: Jul. 27, 1993

[54] PHOTOSTABLE AMORPHOUS SILICON-GERMANIUM ALLOYS

[75] Inventor: Sigurd Wagner, Princeton, N.J.

[73] Assignee: Princeton University, Princeton, N.J.

[21] Appl. No.: 802,119

[22] Filed: Dec. 3, 1991

[51] Int. Cl.$^5$ .............................................. C22C 45/00
[52] U.S. Cl. ................................... 148/403; 420/556; 420/578; 136/258
[58] Field of Search ................ 420/556, 578; 148/403; 136/258 AM

[56] References Cited

U.S. PATENT DOCUMENTS 4,492,810  1/1985  Ovshinsky et al. ................. 420/556
4,839,240  6/1989  Shimizu et al. ..................... 148/403

OTHER PUBLICATIONS

Cretella, M. C., et al., "Hydrogenated a-$Si_xGe_{1-x}$: A Potential Solar Cell Material", J. Electrochem. Soc., vol. 129, Dec. 1982.
Saito, N., et al., "Optical and Electrical . . . Magnetron Sputtering", Thin Solid Films, 115(1984), pp. 253-262.
Luft, W., "Characteristics of Hydrogenated Amorphous Silicon–Germanium Alloys", 20th IEEE Photovoltaic Specialists Conf., Sep. 1988.
Nakamura, G., et al., "Staebler-Wroughlei effect in Hydrogenated Amorphous $Si_{1-x}Ge_x$", Solar Cells (9) 1983, pp. 75-84.
Staebler and Wronski, "Reversible Conductivity Changes in Dsicharge-Produced Amorphous Si," Appl. Phys. Lett. 4:292-294 (1977).
Park et al., "Saturation of the Light-Induced Defect Density in Hydrogenated Amorphous Silicon," Appl. Phys. Lett. 55:2658-2660 (1989).
Park et al., "Dependence of the Saturated LIght-Induced Defect Density on Macroscopic Properties of Hydrogenerated Amorphous Silicon," Appl. Phys. Lett. 57:1440-1442 (1990).
Redfield and Bube, "Reinterpretation of Degradation Kinetics of Amorphous Silicon," Appl. Phys. Lett. 54:1037-1039 (1989).
Chen and Yang, "Kinetics of Light Induced Degradation in A-Si:H Solar Cells," Proc. of 14th Lint'l Conf. on Amorph. Semicond., Aug. 19-23 (1991).
Isomura et al., "What Can We Learn from the Saturation of Light-Induced Defects in Amorphous Hydrogenated Silicon?", Solar Cells 30:177-191 (1991).
Guha, "Light-Induced Effects in Amorphous Silicon Alloys-Design of Solar Cells with Improved Stability," J. Noncrystal. Solids 77,78:1451-1460 (1985).
Kolodzey et al., "Measurements of Light-Induced Degradation in a-Si,Ge:H,F Alloys," Mat. Res. Soc. Symp. Proc. 70:237-242 (1986).
Vanecek et al., "Density of the Gap States in Undoped and Doped Glow Discharge a-Si:H," Solar Energy Matls. 8:411-423 (1983).
Wronski et al., "Sub-Bandgap Optical Absorption and LIght-Induced Defects in Amorphous Silicon," AIP conf. Proc. 157:70-77 (1987).
Wagner et al., "Performance and Modeling of Amorphous Silicon Solar Cells Soaked at High Light Intensity," 22nd IEEE Photovoltaic Specialists Conf., Las Vegas, Nevada, Oct. 7-11 (1991).

Primary Examiner—George Wyszomierski
Attorney, Agent, or Firm—Klarquist, Sparkman, Campbell, Leigh & Whinston

[57] ABSTRACT

Alloys of hydrogenated amorphous silicon and germanium are disclosed that exhibit unexpectedly low saturated defect densities, particularly relative to the initial defect densities of the alloys, so as to render them substantially resistant to Staebler-Wronski degradation. The alloys are producible using conventional equipment, but glow-discharge methods are preferred. The preferred amount of germanium in the alloy is about 15 at. % to about 50 at. %. The alloys are particularly useful for making photovoltaic cells. The alloys can be used as intrinsic semiconductors and doped for use as "n" or "p" materials. Methods for making the alloys are also disclosed.

14 Claims, 2 Drawing Sheets

◇   Prior Art  a-Si:H materials

●   a-Si,Ge:H  alloys

– – –   initial defect density of Prior Art a-Si:Ge films

◇ Prior Art a-Si:H, temp.-up condition
◆ Prior Art a-Si:H, temp.-down condition
○ a-Si,Ge:H alloy, temp.-up condition
● a-Si,Ge:H alloy, temp.-down condition

PHOTOSTABLE AMORPHOUS SILICON-GERMANIUM ALLOYS

BACKGROUND OF THE INVENTION

Photovoltaic cells ("solar cells") are currently under intensive development for use as alternative energy sources. Much of this work has been driven by the urgency to reduce the dependency upon fossil fuels and the need for efficient energy production in space.

Silicon is the favored element for most photovoltaic cells, due in part to its relative abundance.

Hydrogenated amorphous silicon (designated "a-Si:H") has intrinsic semiconductor properties. Hydrogenation is believed to facilitate termination of "dangling bonds" in amorphous silicon. Hydrogenated amorphous silicon can be alloyed with other elements to form semiconductor materials (amorphous silicon "alloys") having a variety of optical bandgap energies, wherein the optical bandgap energy determines what wavelength(s) of light will cause the semiconductor to generate a photovoltaic current. Hydrogenated amorphous silicon can also be doped. Production of "device quality" amorphous silicon solar-cell material generally involves hydrogenation to some extent. "Device quality" is a term used imprecisely by persons skilled in the art but can be considered descriptive of material that works particularly well and efficiently in a solar cell.

Amorphous silicon can be "hydrogen diluted" wherein hydrogen is incorporated during processing into the amorphous atomic network of silicon. Hydrogen dilution is one way to change the optical bandgap energy of silicon.

Unfortunately, amorphous silicon solar cells are prone to a phenomenon in which they experience a significant reduction in power output (i.e., a reduction in conversion efficiency) after the cells have been exposed to light. This light-induced degradation is termed "Staebler-Wronski degradation" after the individuals who first observed and reported the phenomenon. Staebler and Wronski, *Appl. Phys. Lett.* 31:292 (1977). Although agreement has not been reached on the cause(s) of Staebler-Wronski degradation, the phenomenon appears to be a manifestation of an increase in the density of "defects" in the amorphous network upon prolonged exposure to light.

Staebler-Wronski degradation appears to be more or less self-limiting. Accelerated light soaking of a-Si:H and a-Si:H,F films using a krypton ion laser indicated that the light-induced defect density of these materials eventually reaches a saturated value. Park et al., *Appl. Phys. Lett.* 55:2658 (1989); Park et al., *Appl. Phys. Lett.* 57:1440 (1990); Redfield and Bube, *Appl. Phys. Lett.* 54:1037 (1989). Staebler-Wronski degradation is associated with an increase in defect density, but the mechanism by which the defect density changes during light soaking has not been elucidated. The general state of the art indicates that "device quality" materials have saturated defect densities of about $2 \times 10^{16}$ cm$^{-3}$ or less.

In one study of the saturation behavior of a number of a-Si:H films, the lower limit of saturated defect density appeared to be related to the optical bandgap energy of the material. Isomura et al., *Solar Cells* 30:177 (1991). The authors suggested that, by lowering the optical bandgap energy of a-Si:H, the saturated defect density could also be reduced. The optical bandgap energies were lowered by reducing the concentration of hydrogen in the materials (effected by changing process conditions). However, these conclusions were valid only for changing the hydrogen concentration in the films. Also, reducing the concentration of hydrogen may actually increase the number of "dangling bonds" in the amorphous silicon atomic network, thereby degrading initial quality of the material.

Initial defect density may affect the saturated defect density level of a particular amorphous silicon material. (The initial defect density is the density of defects inherently present in the material immediately after annealing). However, the relationship between these two defect densities is unclear and there is considerable disagreement among persons skilled in the art as to what the currently limited experimental findings mean. Aljishi et al., in Fritzche (ed.), *Amorphous Silicon and Related Materials*, p. 887, World Scientific, Singapore, 1988), found that increasing the germanium concentration in amorphous silicon caused a corresponding increase in initial defect density. The effect of germanium on saturated defect density was not reported.

Hence, there remains a need to reduce the saturated defect density of amorphous silicon materials so as to improve the photostability of these materials.

There is also a need for amorphous silicon materials exhibiting a lower saturated defect density.

There is also a need for a photovoltaic cell comprised of an amorphous silicon material that is photostable.

There is also a need for a photovoltaic cell comprised of an amorphous silicon material that, when light-soaked, exhibits a saturated defect density that is not significantly different from the initial defect density of the material or, in any event, less than about $2 \times 10^{16}$ cm$^{-3}$.

SUMMARY OF THE INVENTION

The foregoing needs are met by the present invention which is directed to alloys of hydrogenated amorphous silicon and germanium (designated herein as "a-Si,-Ge:H" alloys). Alloys according to the present invention exhibit saturated defect densities that are unexpectedly low, particularly relative to the initial defect densities of the alloys.

The new alloys can be produced using conventional methods and equipment for producing amorphous silicon, such as, but not limited to, chemical vapor deposition, sputter deposition, and hot-wire deposition. The preferred methods are dc glow discharge and rf glow discharge (the latter commonly known as "plasma-enhanced chemical vapor deposition" or "PECVD"). Since amorphous silicon and alloys thereof are conventionally formed as films on solid-state substrates, the glow discharge methods are preferred because they require appreciably lower substrate temperatures than other methods, thereby allowing a wider range of substrates to be used.

Amorphous silicon can be alloyed with virtually any amount of germanium. However, amounts of germanium greater than about 50 at. % (wherein "at. %" means atomic percent) appear to increase the initial defect density of a-Si,Ge:H alloys to levels greater than about $10^{17}$ cm$^{-3}$, which is the upper limit for "device quality" material suitable for use in photovoltaic cells. The preferred concentration of germanium in alloys according to the present invention is within the range of about 15 at. % to about 50 at. %.

The a-Si,Ge:H alloys according to the present invention are particularly suitable for use in photovoltaic cells. The alloys can be used as intrinsic semiconductors or, when appropriately doped, as "n" or "p" materials.

Alloying hydrogenated amorphous silicon with germanium according to the present invention lowers the optical bandgap energy of amorphous silicon. In fact, the optical bandgap energy drops linearly with increasing concentrations of germanium in the alloy. Alloying increasing concentrations of germanium also yields a corresponding drop in saturated defect density of the alloy. Since increasing the concentration of germanium in hydrogenated amorphous silicon yields a corresponding increase in initial defect density, it is now possible to produce amorphous silicon alloys according to the present invention having a saturated defect density that is substantially unchanged from the initial defect density. Such alloys would experience substantially no Staebler-Wronski degradation upon being exposed to light.

Any amount of germanium seems to yield a reduction in saturated defect density. For example, a germanium concentration in the alloy of about 13 at. % yielded saturated defect densities that were significantly less than the saturated defect densities of the best unalloyed a-Si:H materials.

Additional features of a-Si,Ge:H alloys according to the present invention include an initial defect density of less than $2 \times 10^{16}$ cm$^{-3}$; an optical bandgap energy ($E_{Tauc}$) of 1.62 eV or less; and a concentration of hydrogen within the range of about 1 at. % to about 20 at. %.

The present invention is also directed to methods for making such a-Si,Ge:H alloys, generally comprising introducing a hydrogen-containing fluid reactant (such as hydrogen gas), a silicon-containing fluid reactant (such as SiH$_4$ or SiF$_4$), and a germanium-containing fluid reactant (such as GeF$_4$) to a solid state substrate under conditions favoring reaction of the reactants to form an a-Si,Ge:H alloy on the substrate. The amount of the germanium-containing reactant is preferably controlled relative to the amounts of the other reactants so as to facilitate incorporation of the desired amount of germanium in the alloy. Again, the method is preferably conducted in a plasma so that much lower reaction temperatures are required.

DETAILED DESCRIPTION

Figure 1:
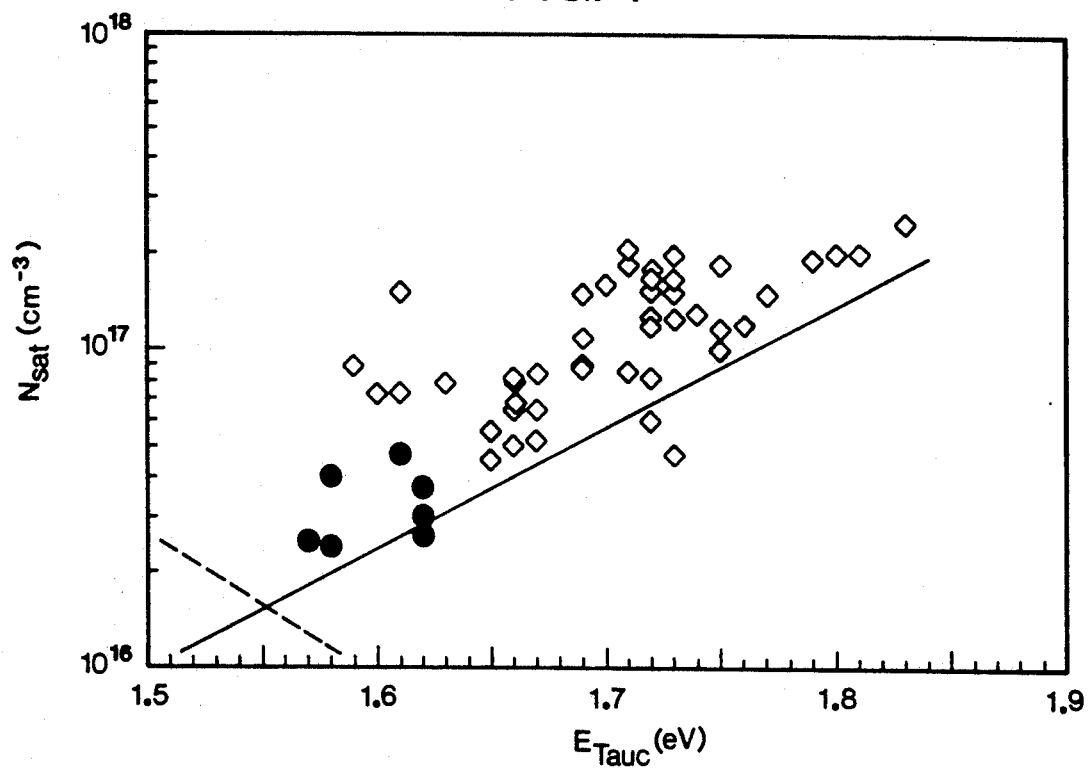
FIG. 1 is a plot of saturated defect densities versus optical bandgap energy of the hydrogenated amorphous silicon-germanium alloys of Examples 1-7 (data plotted as dots), along with a similar plot of prior-art unalloyed hydrogenated amorphous silicon materials (data plotted as diamond-shaped symbols).

I unexpectedly discovered that, by adding germanium to hydrogenated amorphous silicon, the saturated defect density of an amorphous silicon alloy could be reduced to levels never before achieved or believed to be achievable. By reducing the saturated defect density, particularly relative to the initial defect density, the magnitude of Staebler-Wronski degradation experienced by the alloy could be correspondingly reduced. My discovery was unexpected in part because, according to the prior art, adding germanium to amorphous silicon not only reportedly reduces the optical bandgap energy of the amorphous silicon but also increases the initial defect density of the material.

My hydrogenated amorphous silicon-germanium alloys can be produced by any method known in the art for producing conventional amorphous silicon materials. Current practice requires that the alloys be produced as a film on a solid-state substrate. In general, amorphous silicon semiconductor materials are produced by controllably introducing a silicon-containing fluid reactant (e.g., a silicon-containing gas) and, optionally, a hydrogen-containing fluid reactant (e.g., hydrogen gas) to a solid-state substrate under conditions conducive for reaction of the fluid reactants to form hydrogenated amorphous silicon on the substrate.

The preferred methods comprise some form of plasma enhancement or glow-discharge, since these methods allow much lower process temperatures than methods not involving plasma or glow discharge. Examples of such preferred methods include, but are not limited to, dc (direct-current) glow discharge and rf (radio-frequency) glow discharge methods known in the art. These glow-discharge methods are alternative forms of chemical vapor deposition (CVD), wherein rf glow discharge is commonly known as plasma-enhanced chemical vapor deposition (PECVD). Since these methods allow lower process temperatures, a large variety of different types of substrates can be used that would otherwise undergo thermal decomposition at the substantially higher temperatures required with other methods. Other methods (some involving higher temperatures) can be used to make alloys according to the present invention, but the availability of suitable substrates may be more limited. Such other methods include, but are not limited to, sputter deposition, hot-wire deposition, ion beam deposition, and remote discharge techniques.

The preferred glow-discharge methods are conducted using a high-vacuum reaction chamber with necessary supporting equipment. Because these systems are well-known in the art, a figure illustrating their construction is not provided. Glow-discharge reaction chambers can have many different sizes, depending upon the anticipated scale of production. Reaction chambers for laboratory studies are smaller than chambers used for producing large amounts of amorphous silicon. The reaction chamber can be made from any suitable material including, but not limited to, stainless steel, glass, and quartz (stainless steel is preferred for larger chambers).

The reaction chamber for glow-discharge is evacuated using a suitable vacuum pumping apparatus. By way of example, for laboratory-size reaction chambers, a turbomolecular pump backed by a rotary-vane pump is generally used. For larger reaction chambers, a combination of a roots blower and a rotary vane pump can be used.

Reactants are supplied to glow-discharge reaction chambers in gaseous ("chemical vapor") form. The gases must react and form a solid-state deposit of the desired amorphous silicon or amorphous silicon alloy on the substrate. Fortunately, all the reactants needed for forming amorphous silicon alloys according to the present invention are available as gases, including silicon-containing gases such as silane (SiH$_4$) or tetrafluorosilicon (SiF$_4$), germanium-containing gases such as tetrafluorogermanium (GeF$_4$), and hydrogen gas (H$_2$).

For convenience, the reaction chamber is preferably provided with a separate "load-lock" antechamber for adding fresh substrate to the reaction chamber and for removing finished alloy product from the reaction chamber. The reaction chamber is normally always kept evacuated. The antechamber is evacuated as required using a separate vacuum pumping apparatus. The antechamber is isolatable from the reaction chamber by a gate valve or analogous device. To load the reaction chamber (which is already evacuated), substrates (discussed in further detail below) are first placed in the antechamber, which is subsequently closed from the atmosphere. The antechamber is evacuated, the gate valve interconnecting the chambers is opened, and the substrates transferred from the antechamber to the reaction chamber. The gate valve is then closed. The reaction chamber may be further evacuated to a desired "vacuum" level before introducing the reactant gases. As can be readily surmised, these steps are readily amenable to automation.

The "glow discharge" or "plasma" is created in the rarified atmosphere of the reaction chamber by energized electrodes in the chamber. Generally, only two electrodes are required. The electrodes are coupled to a power supply used for energizing the electrodes so as to generate the plasma between and in the vicinity of the electrodes. An example, not intended to be limiting, of a power supply is an rf (radio-frequency) voltage generator. If desired, a grounded screen can be included in the reaction chamber for containing the plasma in a region surrounding and between the electrodes.

For forming amorphous silicon alloys thereon according to the present invention, the substrates (usually supported by "substrate holders" as generally known in the art) can be placed on or near the surface of at least one of the electrodes. In that way, the substrates will be exposed during alloy formation to a maximum plasma intensity.

For chemical vapor deposition to occur on the substrates, they must be heated. The requisite substrate temperature in the reaction chamber for formation of the amorphous silicon alloy can be established using any of a variety of methods known in the art. One suitable heating method is to radiatively heat the substrates by directing a radiant heater, located near the electrode but outside the reaction chamber, toward the substrates. Alternatively, the electrode(s) supporting the substrates can be either heated indirectly by radiative means or heated directly by incorporating electrical heating elements (i.e., resistive elements) into the electrode(s). Further alternatively, the substrate holders can be equipped with heating elements or heated radiatively. Other heating means and methods are within the purview of persons skilled in the art.

As stated hereinabove, glow-discharge methods require that the substrates be heated to substantially lower temperatures than other methods usable to form a-Si,-Ge:H alloys according to the present invention. Representative substrate temperatures for glow discharge are within the range of about 150° C. to about 500° C., preferably within the range of about 200° C. to about 350° C. Other methods not involving glow discharge can require substrate temperatures of 1000° C. or higher.

Also as stated hereinabove, the reaction chamber is evacuated to a very low subatmospheric pressure ("high vacuum") during formation of a-Si,Ge:H alloys via glow discharge. Representative "vacuum" levels are generally within the range of about 0.01 Torr to about 1.0 Torr, preferably within the range of about 0.05 Torr to about 0.5 Torr.

The substrate can be any solid-state material capable of withstanding the temperature and chemical environment inside the reaction temperature. Candidate substrates include, but are not limited to, metals such as polished stainless steel, high-temperature polymer foils, glasses, and quartz. For example, a commonly used glass substrate is made from Corning type 7059 glass (Corning, N.Y.). Preferably, the substrate is not porous because porosity can make evacuation of the chamber containing such substrates difficult. Also, the substrate should not have excessive surface roughness. For best results, the surface roughness should be no greater than 100 Å peak-to-valley. However, substrates having structured roughness, such as multitudinal pyramidal peaks as known in the art, can also be used.

Suitable deposition rates for glow-discharge methods range from about 0.1 Å/sec to about 20 Å/sec. In general, faster deposition rates yield poorer quality alloys that have higher than normal defect densities and other flaws. Therefore, a preferred deposition-rate range is from about 0.1 Å/sec to about 5 Å/sec.

As stated hereinabove, the amorphous silicon-germanium alloys according to the present invention are produced as films on solid-state substrates. Glow-discharge methods are capable of producing a wide range of alloy thicknesses, depending upon how long the substrates are exposed under reaction conditions to the reactive gases in the reaction chamber. For example, it is possible to produce films over 100 μm thick. In general, however, greater thicknesses have correspondingly greater defect densities and are therefore generally "poorer" materials. Therefore, preferred thicknesses range from about 10 Å to about 1.0 μm.

In the glow-discharge or plasma-enhanced reaction chamber, a-Si,Ge:H alloys according to the present invention are formed by surface-catalyzed reactions of ions and free radicals of the reactant gases, formed in the plasma, on the substrate surface. High-energy electrons produced in the plasma impart sufficient energy to the molecules of reactant gases (e.g., SiH$_4$, H$_2$, and GeF$_4$) in the plasma to enable the molecules to react in ways that would require, in the absence of a plasma, much higher temperatures.

The amount of germanium incorporated into the amorphous silicon-germanium alloy according to the present invention is controlled preferably by changing the flow rate of the germanium-containing gas into the reaction chamber relative to the flow rates of the silicon-containing and hydrogen gases. The amount of germanium in the alloy can be any amount greater than zero atomic percent (at. %). However, incorporating increasingly greater amounts of germanium may increase the initial defect density of the alloy. The maximal initial defect density of "device quality" alloys is about $10^{17}/cm^3$ which corresponds to a germanium concentration in the alloy of about 50 at. %. Therefore, about 50 at. % represents a practical upper limit to the amount of germanium that can be incorporated into amorphous silicon for use in photovoltaic cells.

After forming the alloys to the desired thickness, they are removed from the reaction chamber. The alloys are then preferably annealed according to conventional methods.

Although the alloys according to the present invention can potentially be used wherever amorphous silicon and its alloys have utility, the present alloys are particularly adapted for use in photovoltaic cells and other devices in which current is introduced either optically or electrically. The present alloys are intrinsic semiconductors and can be incorporated as "i" layers in semiconductor devices. Alternatively, the present alloys can be doped and used as "n" or "p" semiconductors.

When illuminated ("light-soaked"), the a-Si,Ge:H alloys according to the present invention exhibit saturated defect densities that, surprisingly, decrease with increasing concentration of germanium in the alloy. Alloys having a germanium concentration greater than about 15 to 20 at. % exhibit saturated defect densities that differ insignificantly from the usual initial defect densities of these alloys. However, even lower concentrations of germanium, such as 10 at. %, in the alloys can have saturated defect densities that differ insignificantly from the initial defect densities of the alloys, particularly if the initial defect density is slightly higher than usual. Likewise, higher concentrations of germanium, such as 30 at. % or higher, particularly in alloys exhibiting unusually low initial defect densities, can produce excellent low-bandgap materials exhibiting substantially no photodegradation. Because alloys according to the present invention experience little to no increase in defect density as a result of being light-soaked, they are substantially resistant to Staebler-Wronski degradation. In other words, they are photostable.

Thus, the present invention comprises a way to manufacture photostable low-bandgap photovoltaic materials using conventional processing methods and equipment.

In order to further illustrate the present invention, the following examples are given.

EXAMPLES 1-7

In these examples, I investigated the saturated defect densities of films having lowered optical bandgap energies as a result of alloying hydrogenated amorphous silicon with germanium according to the present invention.

The examples had optical bandgap energies ranging from 1.57 eV to 1.62 eV. With the exception of example 1, all the films were produced by rf glow discharge decomposition of $SiH_4$ or $SiF_4$, along with $GeF_4$ and $H_2$. The preparation conditions and certain initial characteristics of the films are shown in Table I.

TABLE I

|  | Ex. 1 | Ex. 2 | Ex. 3 | Ex. 4 | Ex. 5 | Ex. 6 | Ex. 7 |
|---|---|---|---|---|---|---|---|
| Deposition Method | dc | rf | rf | rf | rf | rf | rf |
| $T_S$ (°C) | 280 | 270 | 250 | 350 | 300 | 350 | 300 |
| Source Gases | $SiH_4$ $GeF_4$ | $SiF_4$ $GeF_4$ | $SiH_4$ $GeF_4$ | $SiH_4$ $GeF_4$ | $SiH_4$ $GeF_4$ | $SiH_4$ $GeF_4$ | $SiH_4$ $GeF_4$ |
| Power (mW/cm$^2$) | 85 | 260 | 130 | 130 | 130 | 130 | 96 |
| Pressure (Torr) | 0.40 | 0.10 | 0.05 | 0.10 | 0.10 | 0.10 | 0.10 |
| d (μm) | 1.4 | 1.5 | 1.6 | 1.2 | 1.3 | 1.0 | 1.4 |
| $E_{Tauc}$ (eV) | 1.57 | 1.62 | 1.58 | 1.62 | 1.61 | 1.58 | 1.62 |
| $\sigma_D$ ($10^{-11}$ S/cm) | 59 | 14.5 | 3.5 | 130 | 10 | 740 | 20.8 |
| $E_A$ (eV) | 0.80 | 0.95 | 0.83 | 0.75 | 0.86 | 0.67 | 0.82 |
| $\sigma_{PH}$ ($10^{-6}$ S/cm) | 6.0 | 4.4 | 0.092 | 4.9 | 1.9 | 9.4 | 3.6 |
| $N_S$ (Init) ($10^{15}$/cm$^3$) | 8.3 | 13.0 | 17.0 | 5.5 | 15.0 | 18.0 | 16.0 |
| $N_{sat}$ ($10^{16}$/cm$^3$) | 2.5 | 3.0 | 2.4 | 2.6 | 4.7 | 4.0 | 3.7 |

In Table I, $E_A$ denotes thermal activation energy; d is the film thickness; $E_{Tauc}$ is the optical bandgap energy; $\sigma_D$ is the dark conductivity; $\sigma_{PH}$ is the photoconductivity; $N_S$ is the initial defect density; and $N_{sat}$ is the saturated defect density. The films all had an initial defect density of less than $2 \times 10^{16}$/cm$^3$. Thus, all the films were of "device quality". (For solar cells, an initial defect density greater than about $2 \times 10^{16}$/cm$^3$ reduces the carrier lifetime and, consequently, the cell performance to unsatisfactory levels.)

The generation of defects in these examples was accelerated by using a Kr+ laser to "light-soak" the films. The laser was focused to deliver light having a power density of 2.5 mW/cm$^2$. The fronts and backs of the films were successively exposed to the laser beam to ensure complete and uniform saturation of each film. Each film was kept at room temperature during light soaking by fan-cooling as required.

Defect density data were extracted from sub-bandgap optical absorption data obtained using the constant photocurrent method (CPM). Vanecek et al., *Solar Energy Mater.* 8:411 (1983). Although several different techniques are known in the art for analyzing the absorption spectrum of a film to obtain a defect-density value, the method of the integrated sub-gap absorption calibrated to Electron Spin Resonance (ESR) was used. Wronski et al., in Stafford and Sabisky (eds.), *AIP Conf. Proc.* 157:70 (American Institute of Physics, NY, 1987). This enabled the defect density data for my alloys to be presented in a manner consistent with Park et al., *Appl. Phys. Lett.* 57:2658 (1989) and Isomura et al., *Solar Cells* 30:177 (1991) pertaining to unalloyed a-Si:H materials. In Table I, initial ($N_S$) and saturated ($N_{sat}$) defect densities are shown.

FIG. 1 shows $N_{sat}$ for the a-Si,Ge:H alloys (dark circles) according to the present invention plotted as a function of optical bandgap energy ($E_{Tauc}$). The Tauc bandgap is determined from optical absorption spectra of the alloys extrapolated as described in Tauc et al., *Phys. Status Solidi* 15:627 (1966). The Tauc bandgap corresponds to the photon energy (in electron volts) at which the optical absorption coefficient of the alloy is $3 \times 10^3$ cm$^{-1}$. For comparison, the data of Park et al. and of Isomura et al., pertaining to unalloyed hydrogenated amorphous silicon materials, are also plotted, represented by the diamond-shaped symbols.

Referring to the diamond-shaped points in FIG. 1, it can be seen that, in unalloyed a-Si:H films produced by conventional low-temperature techniques, the lowest $N_{sat}$ values were reached between 1.65 eV and 1.70 eV. Higher bandgap materials likely contained higher concentrations of hydrogen and, consequently, were less stable. Materials having optical bandgap energies below 1.65 eV were produced under special conditions to minimize the hydrogen concentration in the alloys. As a result, the initial defect densities of these alloys were already high. Alloys having optical bandgap energies in the range of 1.70 to 1.75 eV were representative of a-Si:H solar cell materials as known in the art.

Referring further to FIG. 1, the dark circles represent the hydrogenated amorphous silicon-germanium alloys of examples 1-7, as listed in Table I. As shown in FIG. 1, saturated defect densities of these alloys range from $2.5 \times 10^{16}$ to $3.6 \times 10^{16}$ cm$^{-3}$. These defect densities were the lowest values that I have ever measured in silicon materials produced by glow discharge methods and are comparable to the best materials producible via hot-wire techniques (which are stabilized by reducing their hydrogen content to less than 5 at. %). Mahan and Vanecek, in Stafford (ed.), *AIP Conf. Proc.* 234:186 (Amer. Inst. Phys., New York, 1991).

The hydrogen contents of the alloys of examples 1-7 were within the range of about 8 at. % to about 12 at. %, which is well within the range of about 1 at. % to about 20 at. % typical for "device quality" materials. Thus, the unusual stability of the present alloys is not the result of an abnormally low concentration of hydrogen. Rather, as shown in FIG. 1, their lower saturated defect densities appear to be correlated with their lower optical bandgap energies (less than 1.62 eV). Pure amorphous silicon has an optical bandgap energy of about 1.7 eV; pure amorphous germanium has an optical bandgap energy of about 1.1 eV. The relationship of optical bandgap energy to germanium concentration is substantially linear between these limits, wherein the bandgap energy decreases about 0.06 eV for every 10 at. % increase in germanium concentration. Accordingly, the concentration of germanium in example 1 ($E_{Tauc}$=1.57 eV) is about 22 at. %, about 20 at. % in examples 3 and 6 ($E_{Tauc}$=1.58 eV), about 15 at. % in example 5 ($E_{Tauc}$=1.61 eV), and about 13 at. % in examples 2, 4, and 7 ($E_{Tauc}$=1.62 eV).

The data of examples 1-7 indicate that further increases in the concentration of germanium in a-Si,Ge:H alloys can yield further decreases in saturated defect density. This was unexpected because, according to the prior art, the initial defect density (immediately after annealing) of a-Si,Ge:H films increases with an increase in the concentration of germanium in the film (or with a corresponding decrease in the optical bandgap energy as indicated by the dashed line in FIG. 1). According to the prior art, the higher the initial defect density, the poorer quality the alloy. Aljishi et al., in Fritzche (ed.), *Amorphous Silicon and Related Materials*, pp. 87 (World Scientific, Singapore, 1988). The data of Examples 1-7, in contrast, indicate that a-Si,Ge:H alloys can be produced, using conventional production equipment, that have optical bandgap energies below 1.6 eV with initial defect densities approaching $10^{16}$/cm$^3$ and saturated defect densities of about the same value. Since the initial and saturated defect densities of these materials are about the same, solar cells made from such materials would exhibit very little to no increase in defect density upon prolonged exposure to light.

EXAMPLES 8 and 9

These examples comprises a verification that measurements of saturated defect densities of alloys according to the present invention, such as in Examples 1-7, were made under conditions wherein $N_{sat}$ does not vary with temperature or light intensity. The effects of temperature on the saturated defect densities for an a-Si,Ge:H alloy according to the present invention (having an optical bandgap energy of 1.57 eV) and a prior-art a-Si:H film (having an optical bandgap energy of 1.73 eV) were investigated.

To ascertain the temperature dependence of $N_{sat}$, the films were placed on a temperature-controlled resistive heater during light soaking. The heater temperature was selectively increased stepwise upward, then downward. At each step, the temperature of the heater surface was constant to within three degrees Celsius of the selected temperature. Accurate determinations of the actual temperature of the films were performed using the calibrated reflectance of a He-Ne laser beam from the film surfaces. Actual film temperatures were found to be ten to fifteen degrees C. higher than the temperature of the heater surface. Defect density data were obtained as described in Examples 1-7.

Figure 2:
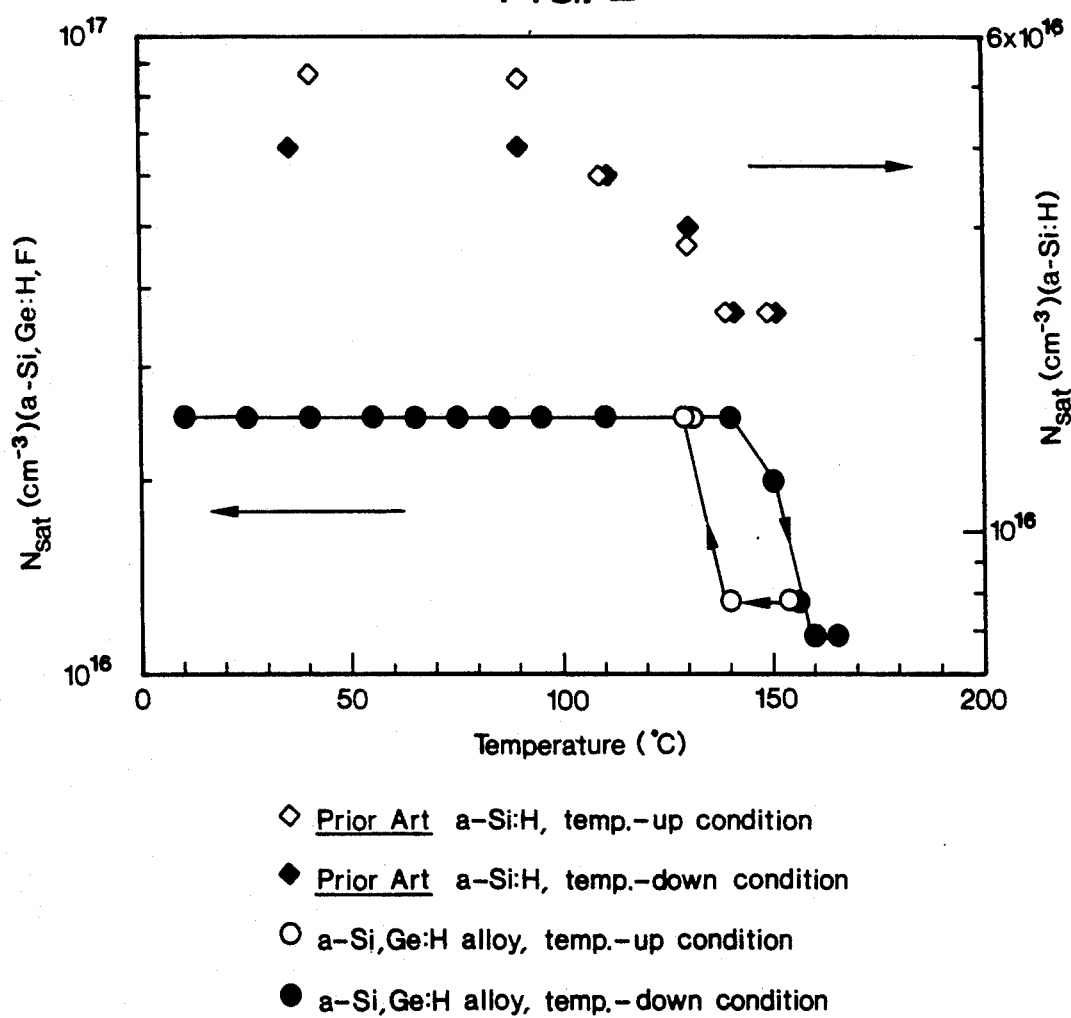
FIG. 2 is a plot of saturated defect density versus temperature for a prior-art hydrogenated amorphous silicon material (data plotted as diamonds) and a hydrogenated amorphous silicon-germanium alloy according to the present invention (data plotted as circles), wherein the temperature dependence of the saturated defect density was determined in both an increasing temperature direction (solid symbols) and a decreasing temperature direction (open symbols).

FIG. 2 shows $N_{sat}$ as a function of film temperature during light soaking. Each initially saturated film was light-soaked at increasingly higher temperatures. In the case of the a-Si,Ge:H alloy according to the present invention, $N_{sat}$ remained independent of temperature up to 140° C., above which $N_{sat}$ decreased sharply (solid circles). The prior-art a-Si:H film, in contrast, exhibited data (plotted as diamonds) that were consistent with the data of Isomura et al., *Solar Cells* 30:177 (1991).

As seen in FIG. 2, the saturated defect density profile of the a-Si,Ge:H film exhibited a hysteresis wherein the maximum $N_{sat}$ is reached at 130° C. in the temperature-down cycle (solid circles) rather than at 140° C. in the temperature-up cycle (open circles). Except for a small difference observed between the temperature-up and temperature-down values at 130° C., the prior-art a-Si:H film showed no hysteresis at higher temperatures.

The data of FIG. 2 suggest that $N_{sat}$ decreases at high temperature because of thermal annealing. $N_{sat}$ remains constant at low temperature because the thermal annealing rate is small compared to the defect generation rate. Near a transition zone where the thermal annealing rate becomes comparable to the defect generation rate, defect exhaustion changes to a defect-balancing situation for determining $N_{sat}$. During the temperature-up cycle, the higher $N_{sat}$ generated in light-soakings at lower temperatures will not anneal out during light-soaking at higher temperatures because of insufficient time. As a result, $N_{sat}$ remains relatively high until the temperature is raised to a value where thermal annealing becomes complete during light-soaking. Thus, the temperature-down cycle is preferred when performing a simple temperature-dependence test of $N_{sat}$.

While the present invention has been described in connection with a detailed description and multiple examples, it will be understood that the present invention is not limited to the description and examples. On the contrary, the present invention is intended to cover all alternatives, modifications, and equivalents as may be included within the spirit and scope of the invention as defined by the appended claims.

I claim:

1. A solid-state alloy suitable for use in photovoltaic cells, comprising hydrogenated amorphous silicon and germanium, wherein the germanium is present in the alloy at a concentration of greater than zero to about 50 at. %, the alloy exhibiting initial and saturated defect-density values of no greater than $10^{17}/cm^3$.

2. An alloy as recited in claim 1 having an initial defect density of no greater than $5 \times 10^{16}/cm^3$.

3. An alloy as recited in claim 1 on a solid-state substrate.

4. A solid-state alloy, comprising hydrogenated amorphous silicon and germanium, wherein the germanium is present in the alloy at a concentration within a range of greater than zero to about 50 at. %, the alloy exhibiting an $E_{Tauc}$ value of 1.62 eV or less and a saturated defect density of less than $10^{17}$ cm$^{-3}$.

5. An alloy as recited in claim 4 comprising hydrogen at a concentration within a range of about 1 at. % to about 20 at. %.

6. An alloy as recited in claim 5 comprising germanium at a concentration within a range of about 10 at. % to about 30 at. %.

7. An alloy as recited in claim 6 having an initial defect density of less than $2 \times 10^{16}$ cm$^{-3}$.

8. An alloy as recited in claim 4 having an initial defect density of no greater than $5 \times 10^{16}/cm^3$.

9. A solid-state alloy for use in photovoltaic cells, comprising amorphous silicon, germanium at a concentration in the alloy of about 10 at. % to about 30 at. %, and hydrogen at a concentration in the alloy of about 1 at. % to about 20 at. %, the alloy exhibiting an $E_{Tauc}$ value of 1.62 eV or less, a saturated defect density of less than $10^{17}$ cm$^{-3}$, and an initial defect density of no greater than $5 \times 10^{16}/cm^3$.

10. An alloy as recited in claim 9 having a germanium concentration of greater than about 13 at. %.

11. An alloy as recited in claim 10 having an initial defect density of less than $2 \times 10^{16}$ cm$^{-3}$.

12. A photovoltaic cell having a layer comprised of the alloy of claim 1.

13. A photovoltaic cell having a layer comprised of the alloy of claim 4.

14. A photovoltaic cell having a layer comprised of the alloy of claim 9.

* * * * *